(12) United States Patent
Zainuddin et al.

(10) Patent No.: US 12,394,491 B2
(45) Date of Patent: Aug. 19, 2025

(54) APPARATUS AND METHOD FOR SELECTIVELY REDUCING CHARGE PUMP SPEED DURING ERASE OPERATIONS

(71) Applicant: Sandisk Technologies, Inc., Milpitas, CA (US)

(72) Inventors: Abu Naser Zainuddin, San Ramon, CA (US); Jiahui Yuan, Fremont, CA (US); Mark Shlick, Ganey-Tikva (IL); Shemmer Choresh, Tel-Aviv (IL)

(73) Assignee: Sandisk Technologies, Inc., Milpitas, CA (US)

( * ) Notice: Subject to any disclaimer, the term of this patent is extended or adjusted under 35 U.S.C. 154(b) by 195 days.

(21) Appl. No.: 18/355,352

(22) Filed: Jul. 19, 2023

(65) Prior Publication Data

US 2024/0257878 A1 Aug. 1, 2024

Related U.S. Application Data

(60) Provisional application No. 63/481,887, filed on Jan. 27, 2023.

(51) Int. Cl.
*G11C 16/14* (2006.01)
*G11C 5/14* (2006.01)
*G11C 16/32* (2006.01)

(52) U.S. Cl.
CPC ............. *G11C 16/14* (2013.01); *G11C 5/145* (2013.01); *G11C 16/32* (2013.01)

(58) Field of Classification Search
CPC ......... G11C 16/14; G11C 16/32; G11C 16/10; G11C 16/3459; G11C 16/0483; G11C 16/16; G11C 16/30; G11C 16/3418; G11C 16/3445; G11C 5/145; G11C 7/04
See application file for complete search history.

(56) References Cited

U.S. PATENT DOCUMENTS

| | | | |
|---|---|---|---|
| 6,421,757 B1 * | 7/2002 | Wang | G11C 16/10 711/167 |
| 10,324,859 B2 | 6/2019 | Linnen et al. | |
| 2010/0061172 A1 | 3/2010 | Chen | |
| 2017/0154666 A1 | 6/2017 | Park | |
| 2021/0166770 A1 | 6/2021 | Piccardi et al. | |

FOREIGN PATENT DOCUMENTS

| | | |
|---|---|---|
| WO | 2008036609 A2 | 3/2008 |
| WO | 2021086439 A1 | 5/2021 |

* cited by examiner

*Primary Examiner* — Sultana Begum
(74) *Attorney, Agent, or Firm* — PEARL COHEN ZEDEK LATZER BARATZ LLP

(57) ABSTRACT

An apparatus is provided that includes a plurality of non-volatile memory cells, a charge pump circuit configured to receive a clock signal and provide a plurality of voltages to the non-volatile memory cells, and a control circuit coupled to the non-volatile memory cells and the charge pump circuit. The control circuit is configured to reduce a current consumed by the apparatus by selectively reducing a clock rate of the clock signal depending on a memory operation being performed on the non-volatile memory cells.

18 Claims, 21 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

| Chip Temperature $T_O$ (°C) | $CLK_{P1}$ | $CLK_{P2}$ |
|---|---|---|
| $75 < T_O \leq 85$ | $CLK_{P1n}$ | $CLK_{P2n}$ |
| $65 < T_O \leq 75$ | $0.95 \times CLK_{P1n}$ | $0.97 \times CLK_{P2n}$ |
| $35 < T_O \leq 65$ | $0.94 \times CLK_{P1n}$ | $0.96 \times CLK_{P2n}$ |
| $15 < T_O \leq 35$ | $0.92 \times CLK_{P1n}$ | $0.90 \times CLK_{P2n}$ |
| $5 < T_O \leq 15$ | $0.89 \times CLK_{P1n}$ | $0.87 \times CLK_{P2n}$ |
| $-2 \leq T_O \leq 5$ | $0.80 \times CLK_{P1n}$ | $0.83 \times CLK_{P2n}$ |

FIG. 15

APPARATUS AND METHOD FOR SELECTIVELY REDUCING CHARGE PUMP SPEED DURING ERASE OPERATIONS

CLAIM OF PRIORITY

The present application claims priority from U.S. Provisional Patent Application No. 63/481,887, entitled "APPARATUS AND METHOD FOR SELECTIVELY REDUCING CHARGE PUMP SPEED DURING ERASE OPERATIONS," filed Jan. 27, 2023, which is incorporated by reference herein in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 7A-7E depict various threshold voltage distributions and describe a process for programming non-volatile memory.

FIG. 15 is a diagram of example values of a first clock signal and a second clock signal as a function of die temperature.

DETAILED DESCRIPTION

Figure 1:
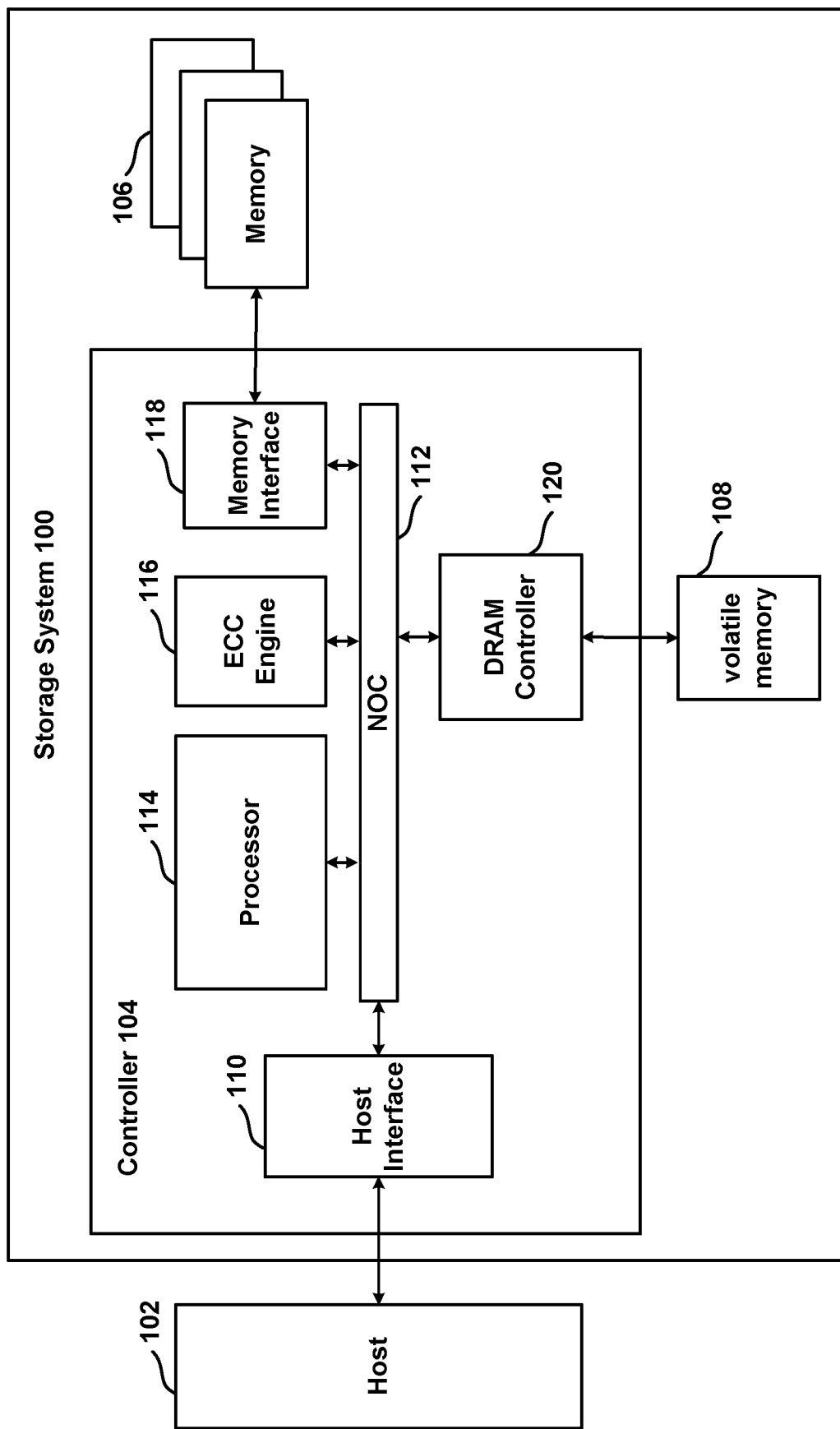
FIG. 1 is a block diagram depicting one embodiment of a memory system.

In memory systems, charge pump circuits are often used to provide various voltages for memory operations, such as program voltages, read voltages and erase voltages. In some instances, power supply current may exceed specified maximum power supply current limits. For example, at low temperatures during erase operations, power supply current peaks may be higher than at higher temperatures. Technology is described for selectively reducing a clock rate of charge pump circuits to reduce power supply current during erase operations.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

Indeed, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines may be concurrently erased.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
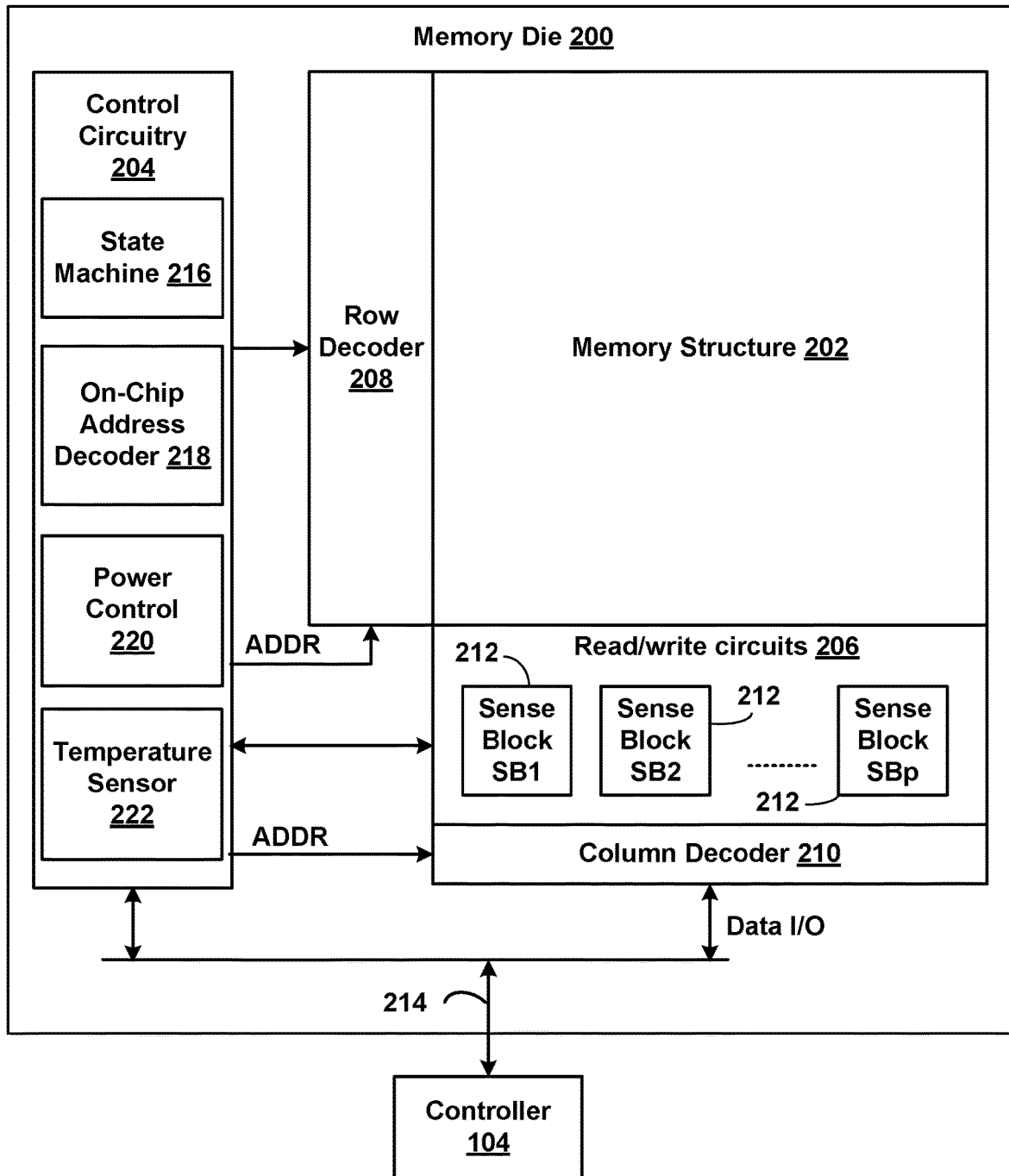
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, a power control circuit 220, and a temperature sensor 222 circuit. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters. In an embodiment, temperature sensor circuit 222 detects a die temperature at memory die 200.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages such as program voltages, read voltages and erase voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-SbTe super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
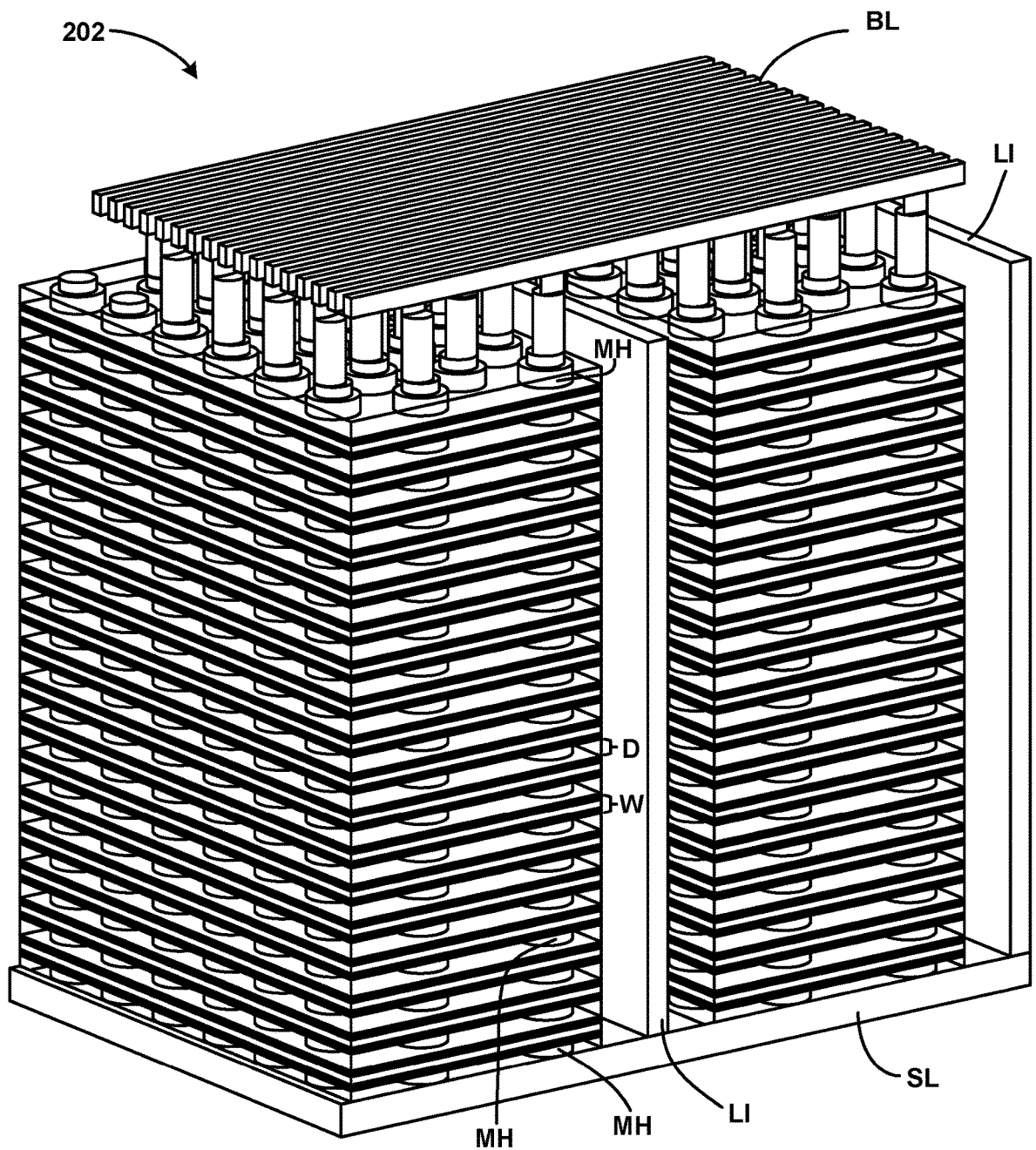
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
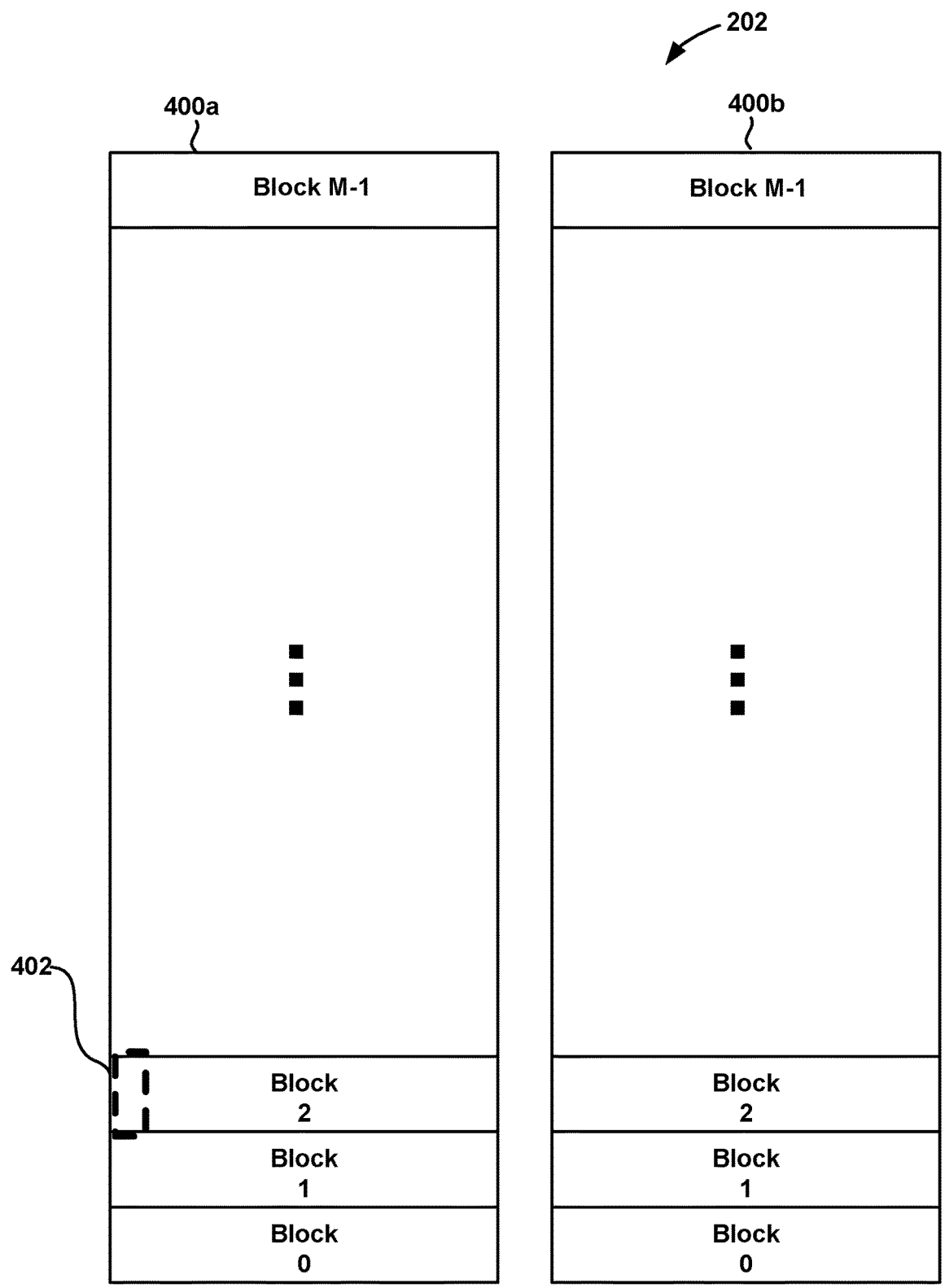
FIG. 4A is a block diagram of a memory structure having two planes.

FIG. 4A is a block diagram explaining one example organization of memory structure 202, which is divided into two planes 400a and 400b. In an embodiment, both planes are on the same memory die 200 (FIG. 2). In other embodiments, the separate planes may be on separate memory die. Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
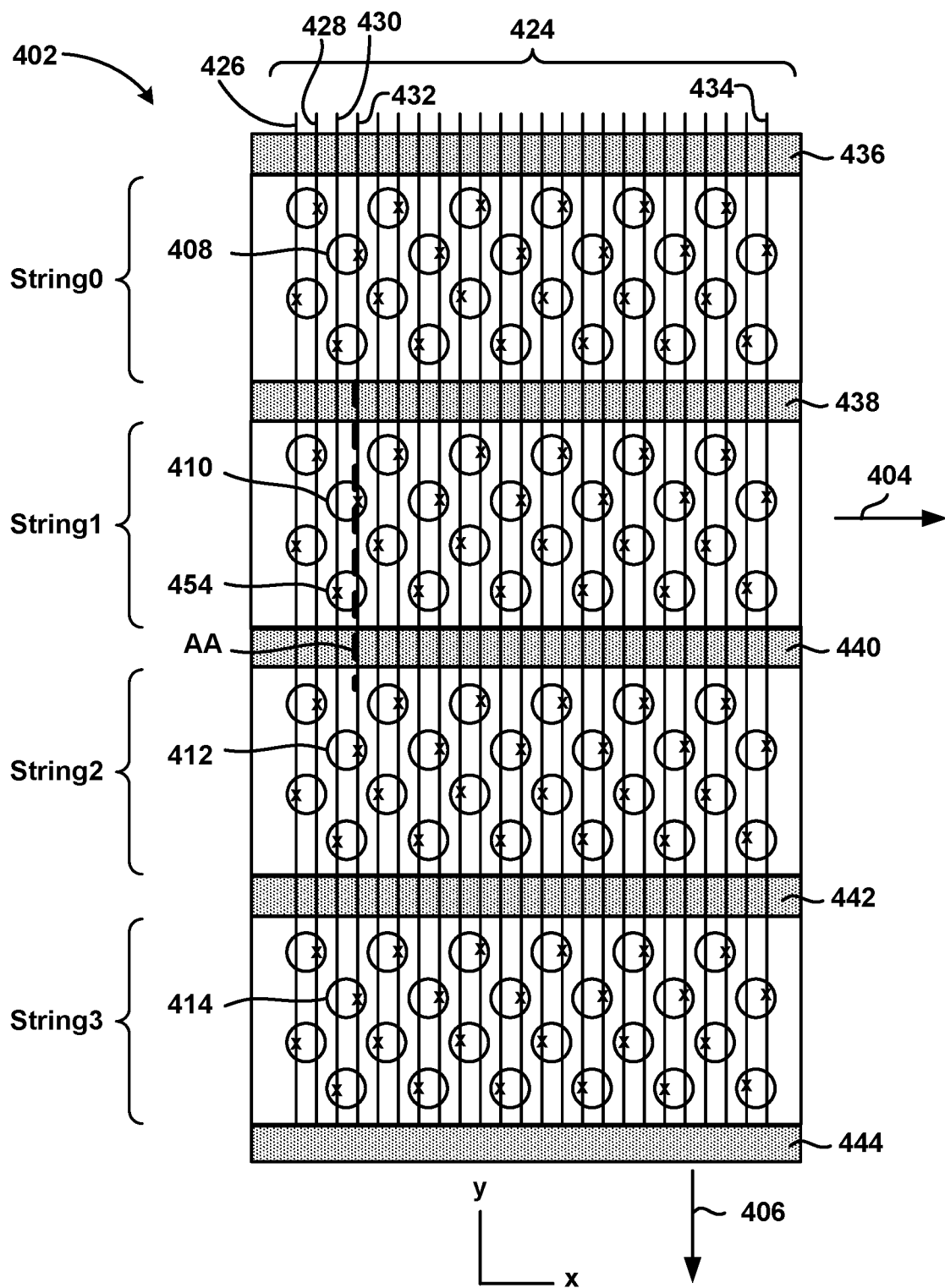
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, Sting2 and String3. In the layers of the block that implement memory cells, String0, String1, Sting2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
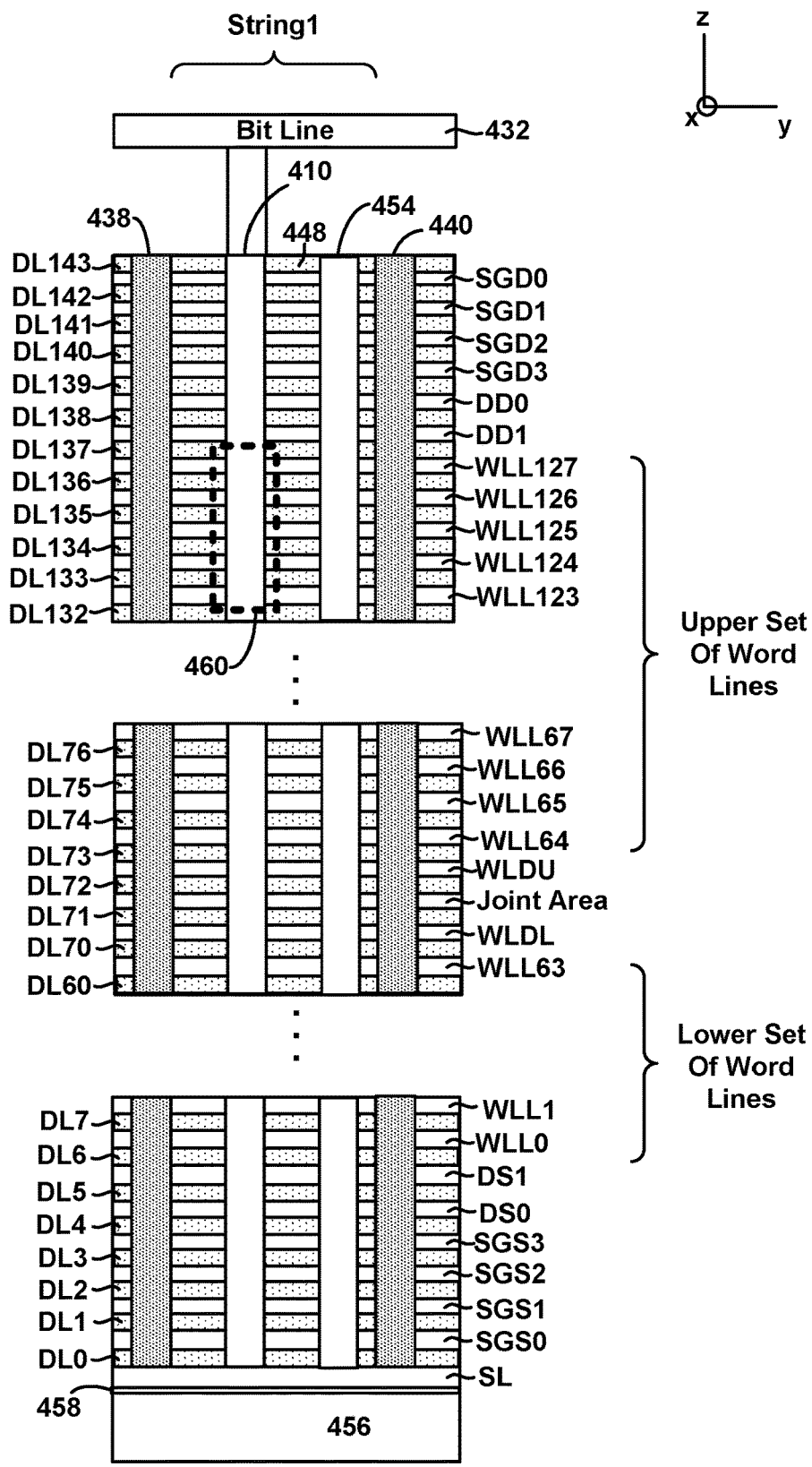
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layer DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
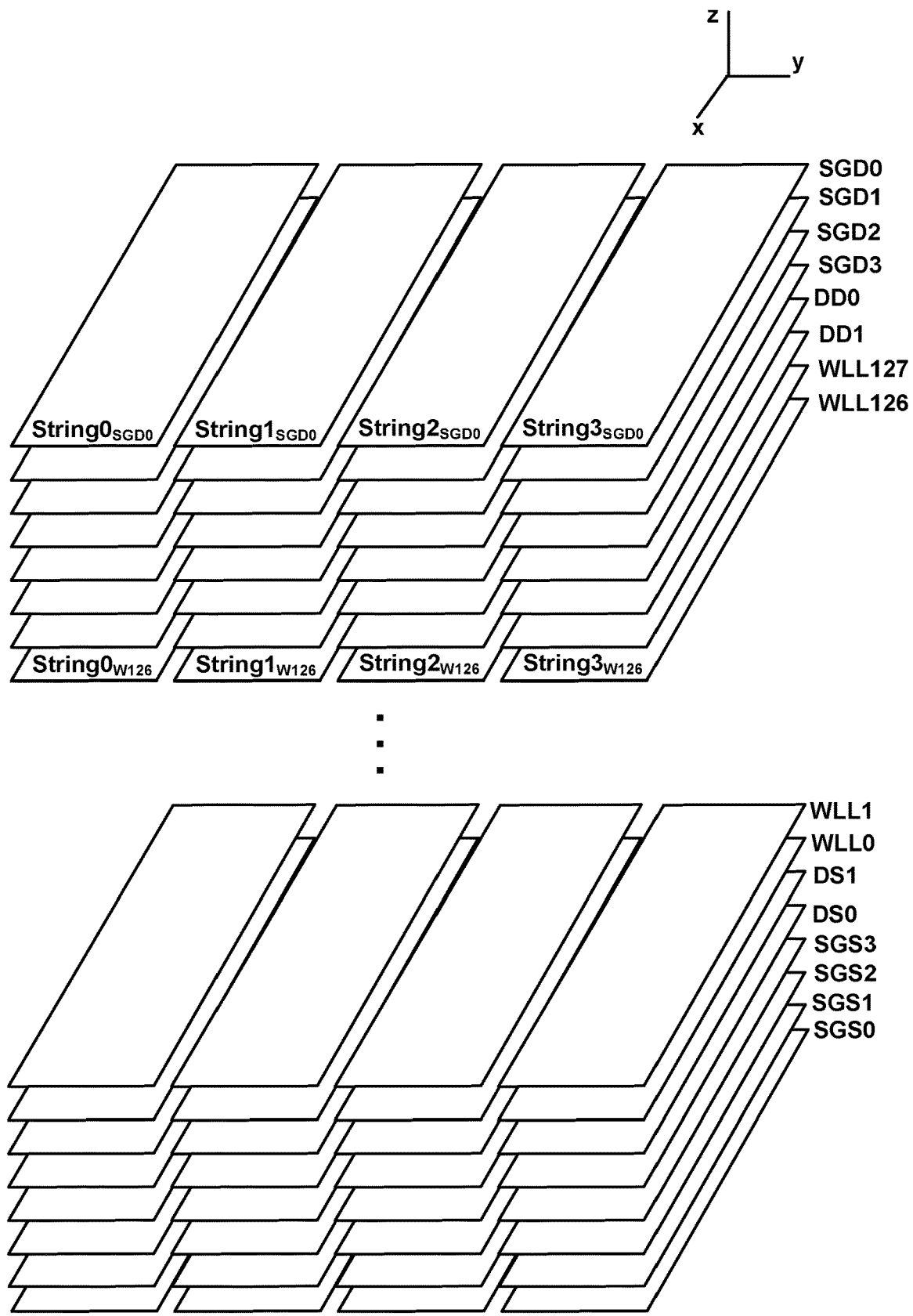
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions String$0_{W126}$, String$1_{W126}$, String$2_{W126}$ and String$3_{W126}$. In an embodiment, the four word line fingers on a same level are connected together. In another embodiment, each word line finger operates as a separate word line.

Likewise, drain side select gate layer SGD0 (the top layer) is divided into regions Strin$0_{SGD0}$, String$1_{SGD0}$, String$2_{SGD0}$ and String$3_{SGD0}$, also known as fingers or select line fingers. In an embodiment, the four select line fingers on a same level are connected together. In another embodiment, each select line finger operates as a separate word line.

Figure 4E:
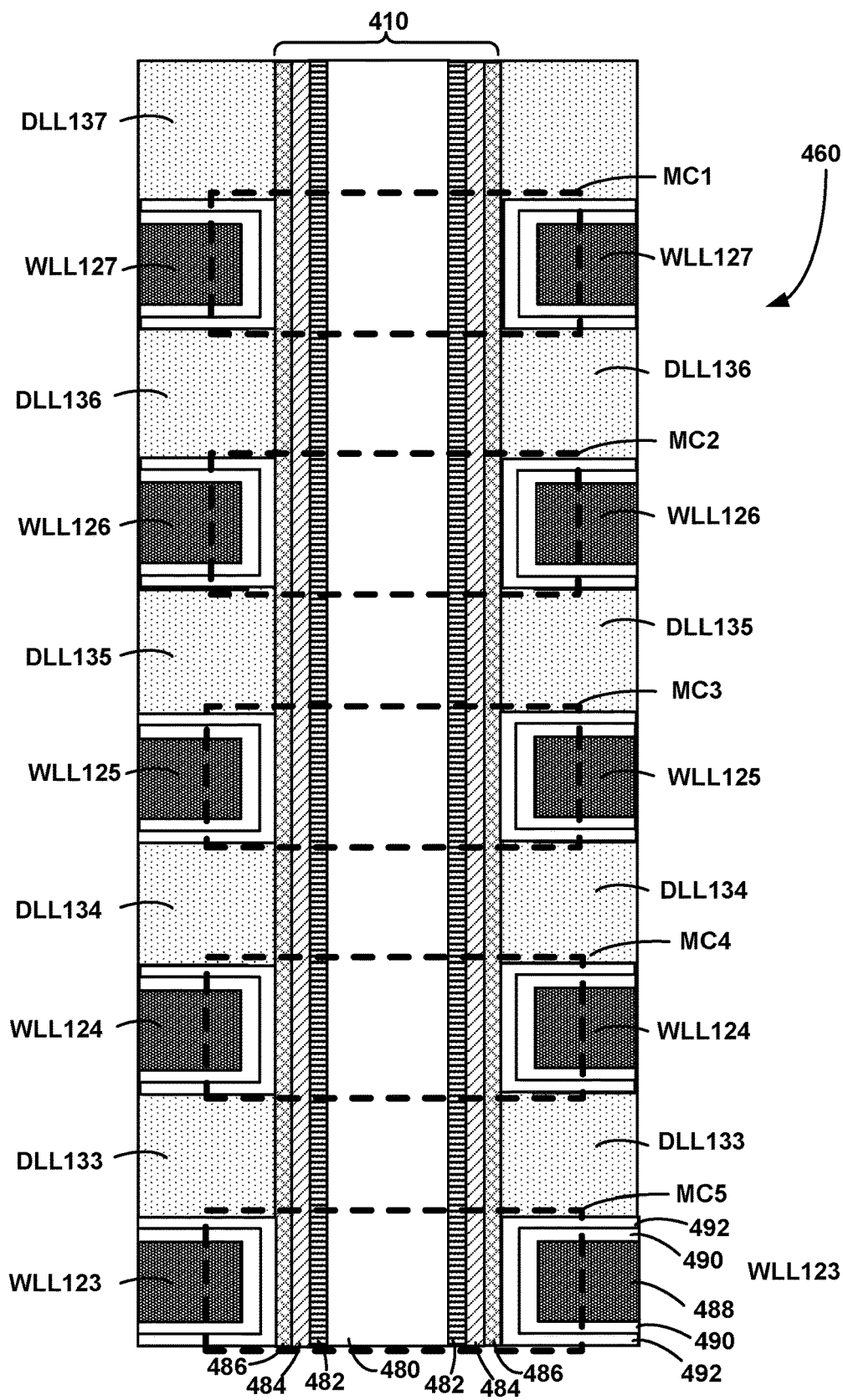
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., SiO), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
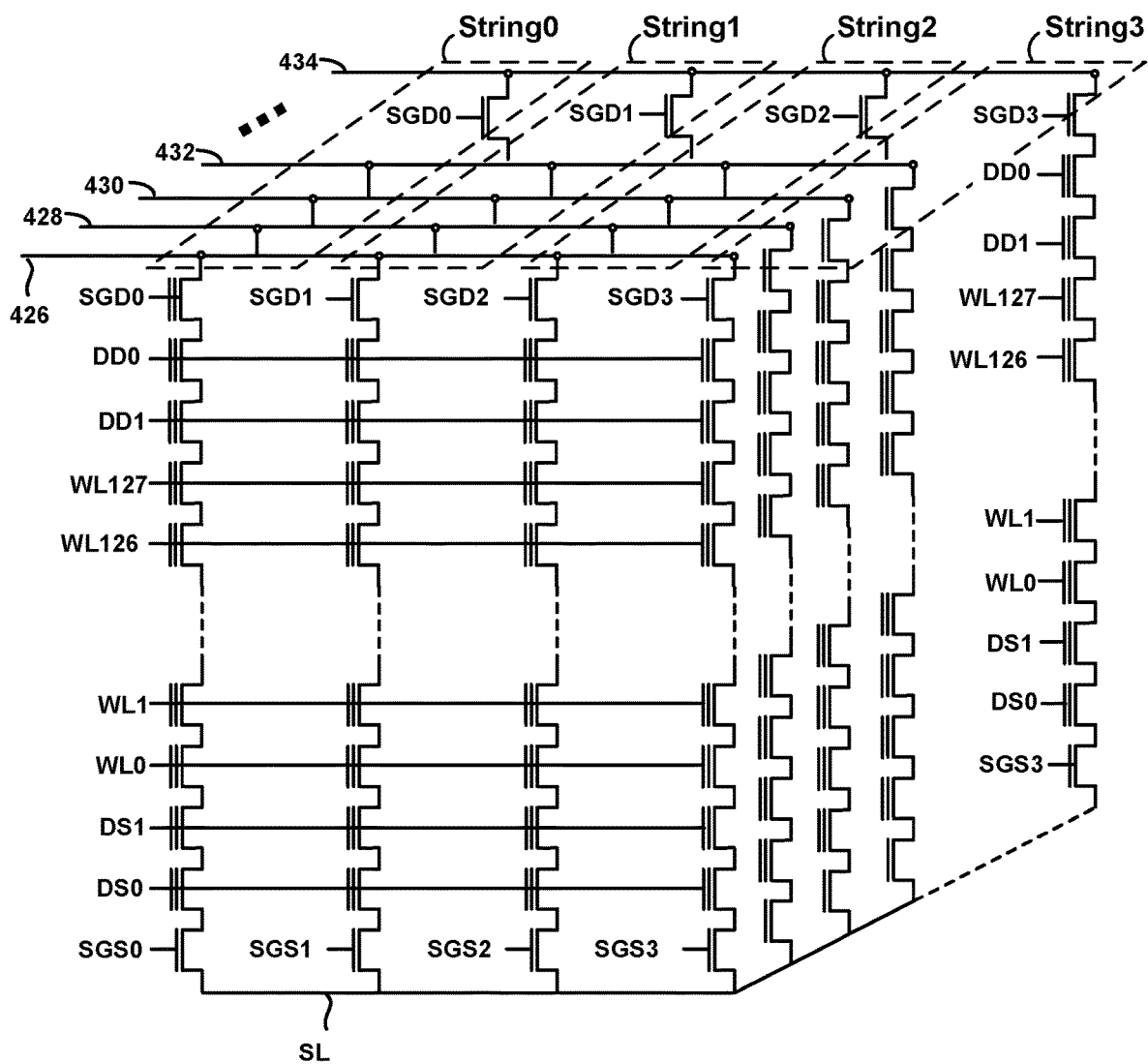
FIG. 4F is a schematic of a plurality of NAND strings.

FIG. 4F is a schematic diagram of corresponding to portion 402 in Block 2 of FIGS. 4A-E, including bit lines 426, 428, 430, 432, ... 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
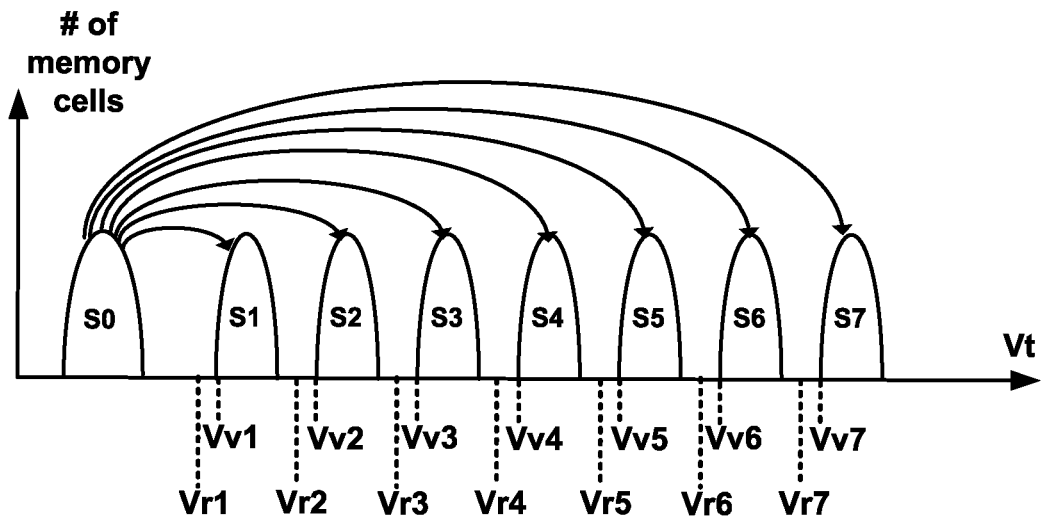
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIGS. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figures 7A, 7B, 7C, 7D, 7E:
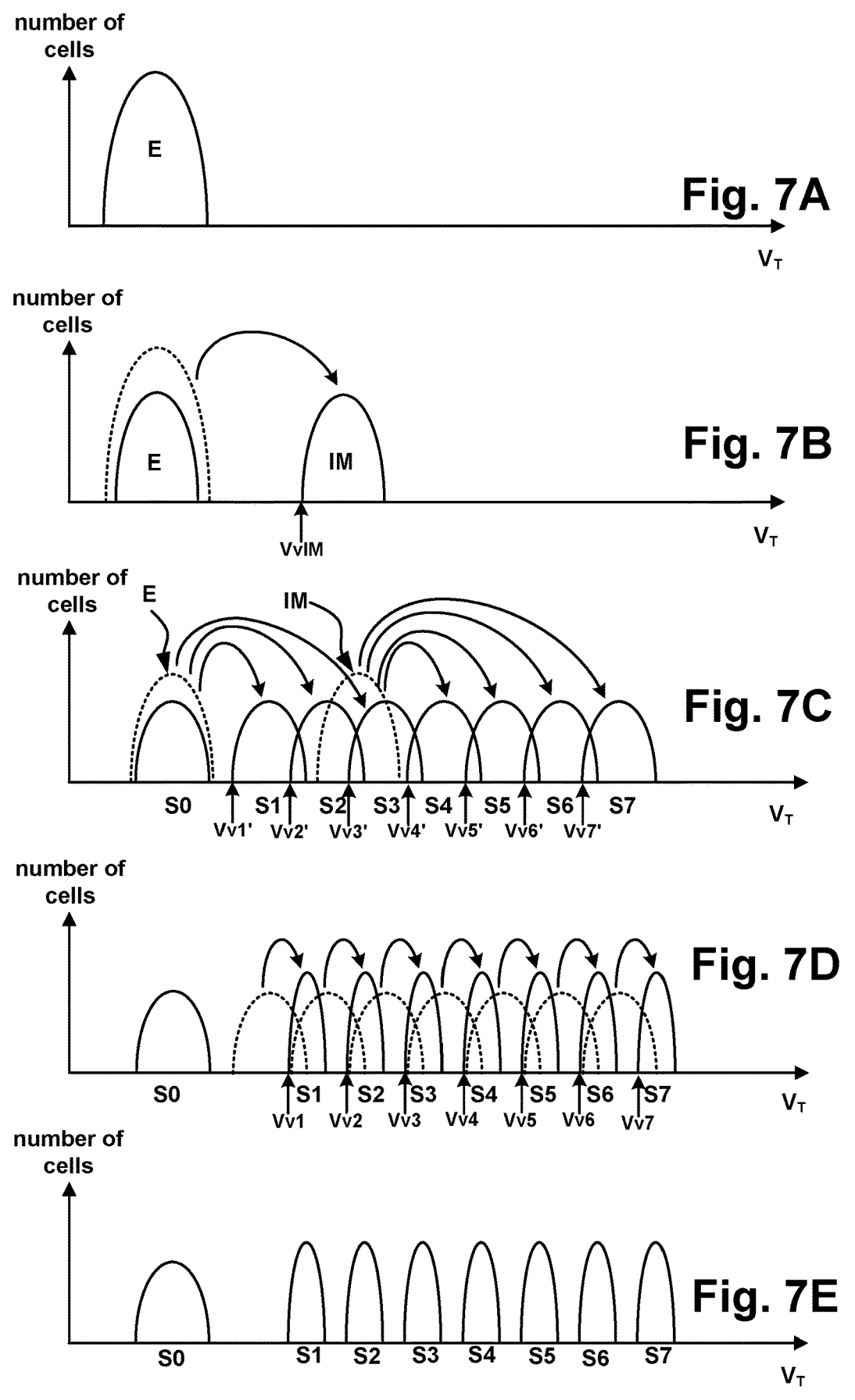

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
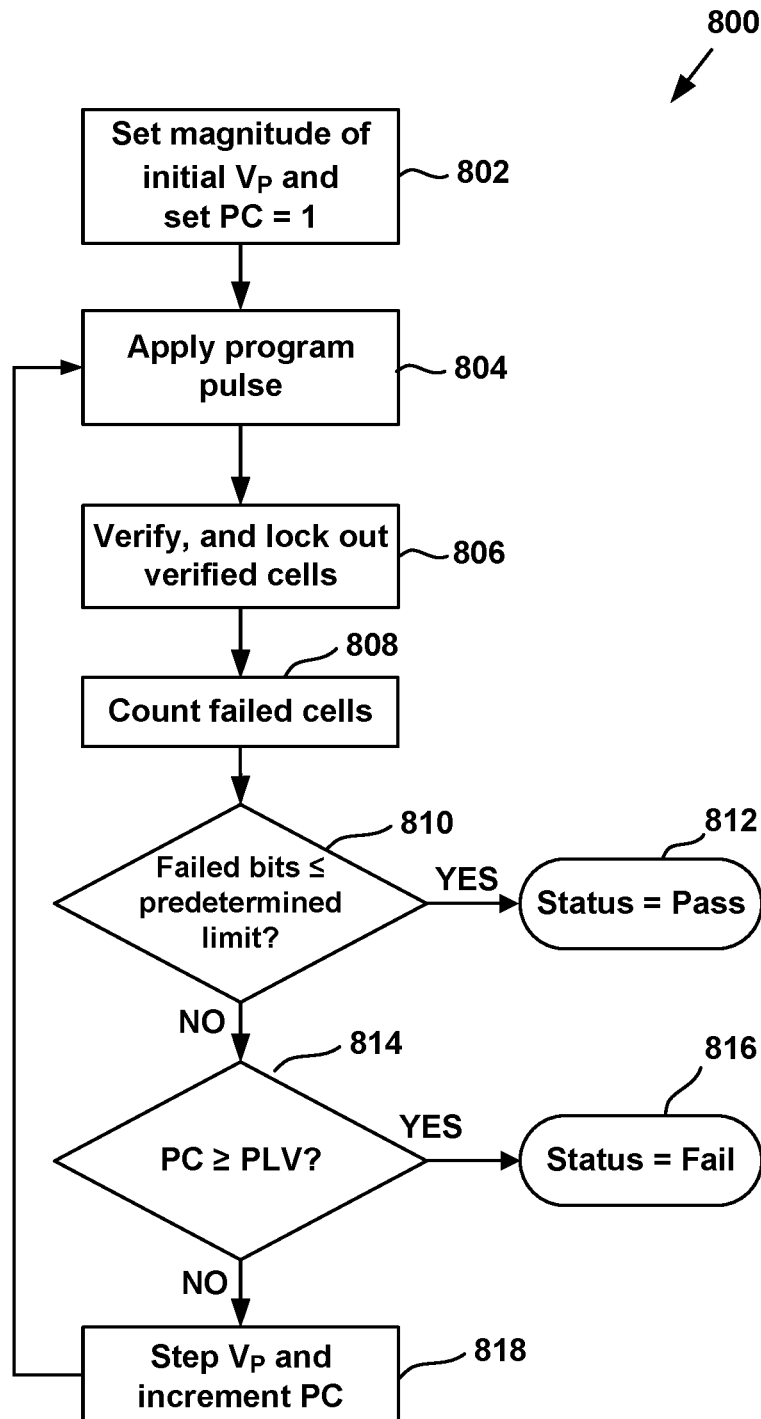
FIG. 8 is a flowchart describing an embodiment of a process for programming non-volatile memory.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 818 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 800 loops back to step 804 and another program pulse is applied to the selected word line so that another iteration (steps 804-818) of programming process 800 is performed. Each pass through steps 804-818 is referred to herein as a "program loop." The program limit value PLV described above therefore specifies a maximum number of program loops that may be used to program the memory cells coupled to the selected word line. The comparison performed at step 814 is referred to herein as a "maximum program count test."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
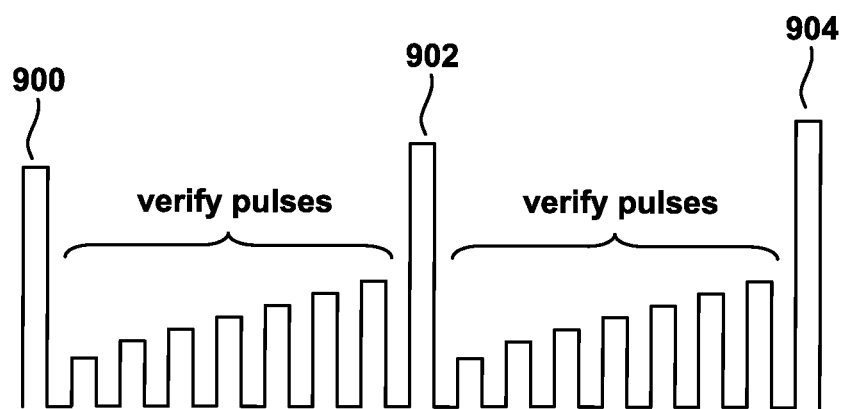
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

As described above, in embodiments a population of memory cells to be programmed is first erased so that all memory cells in the population are in an erased data state (e.g., state S0 in FIG. 5 or state E in FIG. 7A) prior to programming. When the programmed memory cells are subsequently selected to be re-programmed, the memory cells are again erased prior to programming.

Each program and erase iteration of a memory cell or group of memory cells is referred to herein as a "program-erase cycle," and the number of program-erase cycles performed on a memory cell or group of memory cells is referred to herein as a "program-erase cycle count" or "PEC." In embodiments, a Controller Device maintains a record of the program-erase cycle count for each memory cell or group of memory cells of a memory structure (e.g., memory structure 202 of FIG. 2A).

An erase operation for memory cells in a block typically involves one or more "erase-verify iterations," also referred to as "erase-verify loops," where each iteration involves channel boosting followed by an erase verify test, until the erase operation is completed.

In an embodiment of an erase-verify loop, the voltages of the channels are boosted while holding the voltages of the word lines at a low level (e.g., at or close to 0 V). The channels are boosted by applying an erase pulse to the block. In one technique, the erase pulses are applied to the substrate, causing holes to be injected into the channels via the source ends of the NAND strings.

In another technique, the channels are boosted by generating holes at the source end and/or drain end of the NAND strings using gate-induced drain leakage (GIDL). Boosting the channels creates a large channel-to-gate voltage which drives holes into the charge trapping layers, lowering the threshold voltage of each memory cell.

An erase verify test, which is a sensing operation, can be performed after applying each erase pulse to determine if the threshold voltage of each memory cell has been lowered below an erase verify voltage. If the threshold voltage of a memory cell is below the erase verify voltage, the memory cell passes the erase verify test. If the threshold voltage of a memory cell is not below the erase verify voltage, the memory cell fails the erase verify test.

In embodiments, an erase operation for a block completes when fewer than a threshold number of memory cells in the block fail the erase verify test. As used herein, the threshold number is also called a "fail bits threshold number." The fail bits threshold number is sometimes referred to as a "bitscan pass/fail" or "BSPF" value. In an embodiment, the fail bits threshold number BSPF is the number of bits that can be corrected by error correction codes (ECC) during a read process for the page of memory cells. In other embodiments, other criteria may be used for specifying the fail bits threshold number BSPF. In an embodiment, the fail bits threshold number BSPF has a fixed value. For example, the fail bits threshold number BSPF=25, or some other value.

In embodiment, an erase operation for a block must complete within a maximum number of erase-verify loops ($EV_M$). For example, the maximum number of erase-verify loops $EV_M$ may be 6, or some other value. A block erase failure occurs if more than the fail bits threshold number BSPF of memory cells in the block fail erase verify tests within the maximum number of erase-verify loops $EV_M$. For example, if the fail bits threshold number BSPF=25 and the maximum number of erase-verify loops $EV_M$=6, a block erase failure may occur if more than 25 memory cells in the block fail erase verify tests within 6 erase-verify loops.

Figure 10:
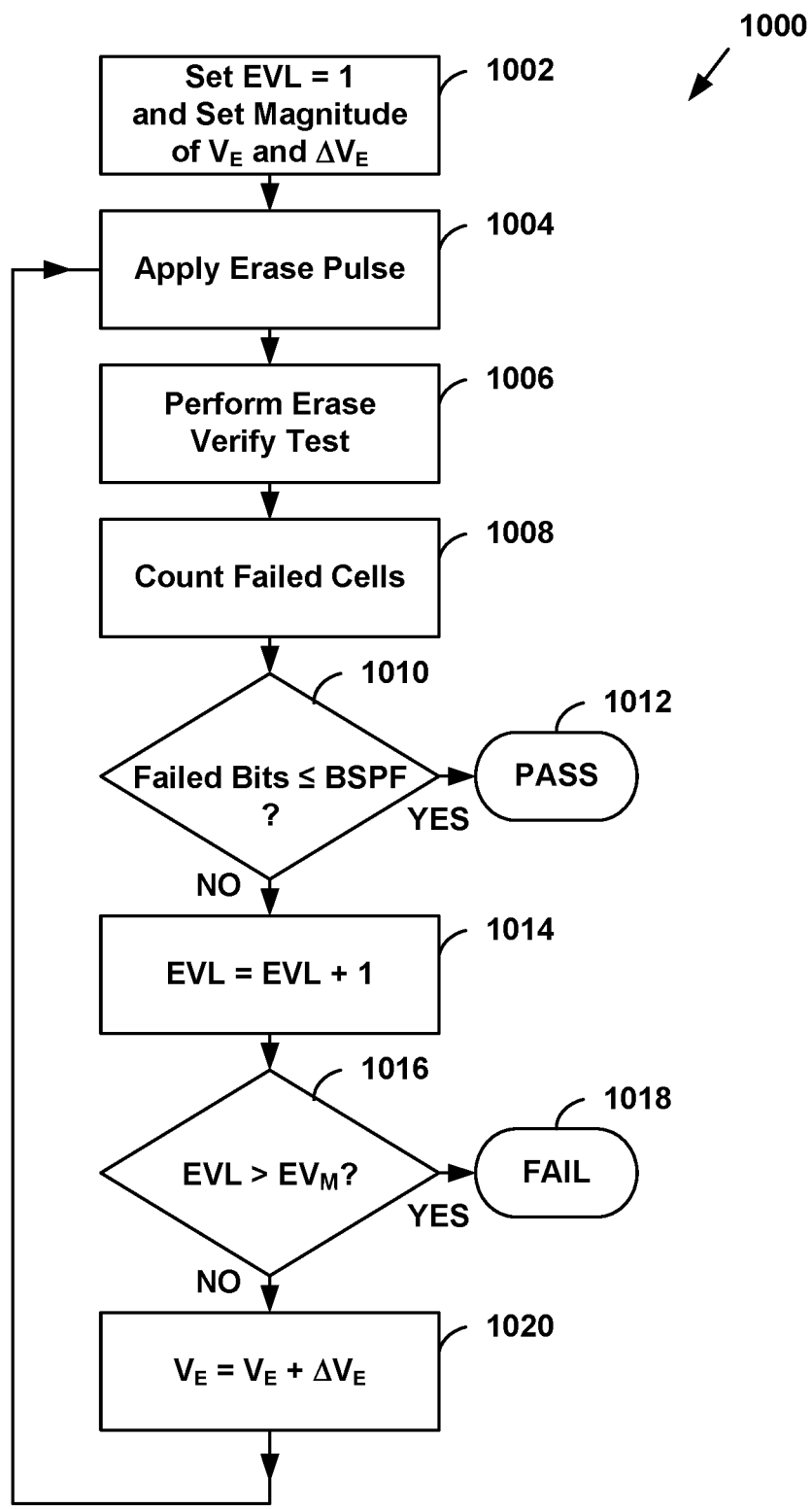
FIG. 10 depicts a flowchart describing an embodiment of a process for erasing a population of memory cells.

FIG. 10 is a flowchart describing an embodiment of a process 1000 for erasing a population of memory cells (e.g., an erase block of memory cells). In an example embodiment, process 1000 is performed on memory die 106 (FIG. 1) using the control circuits discussed above. For example, process 1000 can be performed at the direction of state machine 216 (FIG. 2).

In an embodiment, state machine 216 maintains as erase-verify loop counter EVL for the block of memory cells in process 1000. In step 1002, erase-verify loop counter EVL is initialized at 1, an erase voltage ($V_E$) is initialized to a starting erase voltage $V_{Einit}$ (e.g., between about 12V to about 16V, or some other value), and an erase voltage step $\Delta V_E$ is set (e.g., 0.2V or some other value).

At step 1004, an erase pulse having a magnitude $V_E$ is applied to the memory cells of the erase block. At step 1006, an erase verify test is performed on the memory cells of the erase block, such as described above.

At step 1008, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1010, a determination is made whether the count from step 1008 is less than or equal to fail bits threshold number BSPF. If a determination is made at step 1010 that the count at step 1008 is less than or equal to fail bits threshold number BSPF, then at step 1012 erase process 1000 is deemed to have passed.

In contrast, if at step 1010 a determination is made that the count at step 1008 is not less than or equal to fail bits threshold number BSPF, then at step 1014 erase-verify loop counter EVL is incremented by 1.

At step 1016, a determination is made whether erase-verify loop counter EVL is greater than the maximum number of erase-verify loops $EV_M$. If erase-verify loop counter EVL is greater than the maximum number of erase-verify loops $EV_M$, then at step 1018 erase process 1000 is deemed to have failed. In other words, within the maximum number of erase-verify loops $EV_M$ more than the fail bits threshold number BSPF of memory cells in the erase block fail erase verify tests, and the erase is deemed to have failed.

In contrast, if a determination is made that erase-verify loop counter EVL is less than or equal to the maximum number of erase-verify loops EV, at step 1020 erase voltage $V_E$ is incremented by erase voltage step $\Delta V_E$. Process 1000 then loops back to step 1004 and another erase pulse is applied to the memory cells of the erase block.

Thus, each pass through steps 1004-1010 is an example of an erase-verify loop. The loop of steps 1004-1020 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

In process 1000, if at step 1010 a determination is made that the count at step 1008 is less than or equal to fail bits threshold number BSPF then the value of erase-verify loop counter EVL is the number of erase-verify loops required for the erase block to pass the erase verify test of step 1006.

Figure 11:
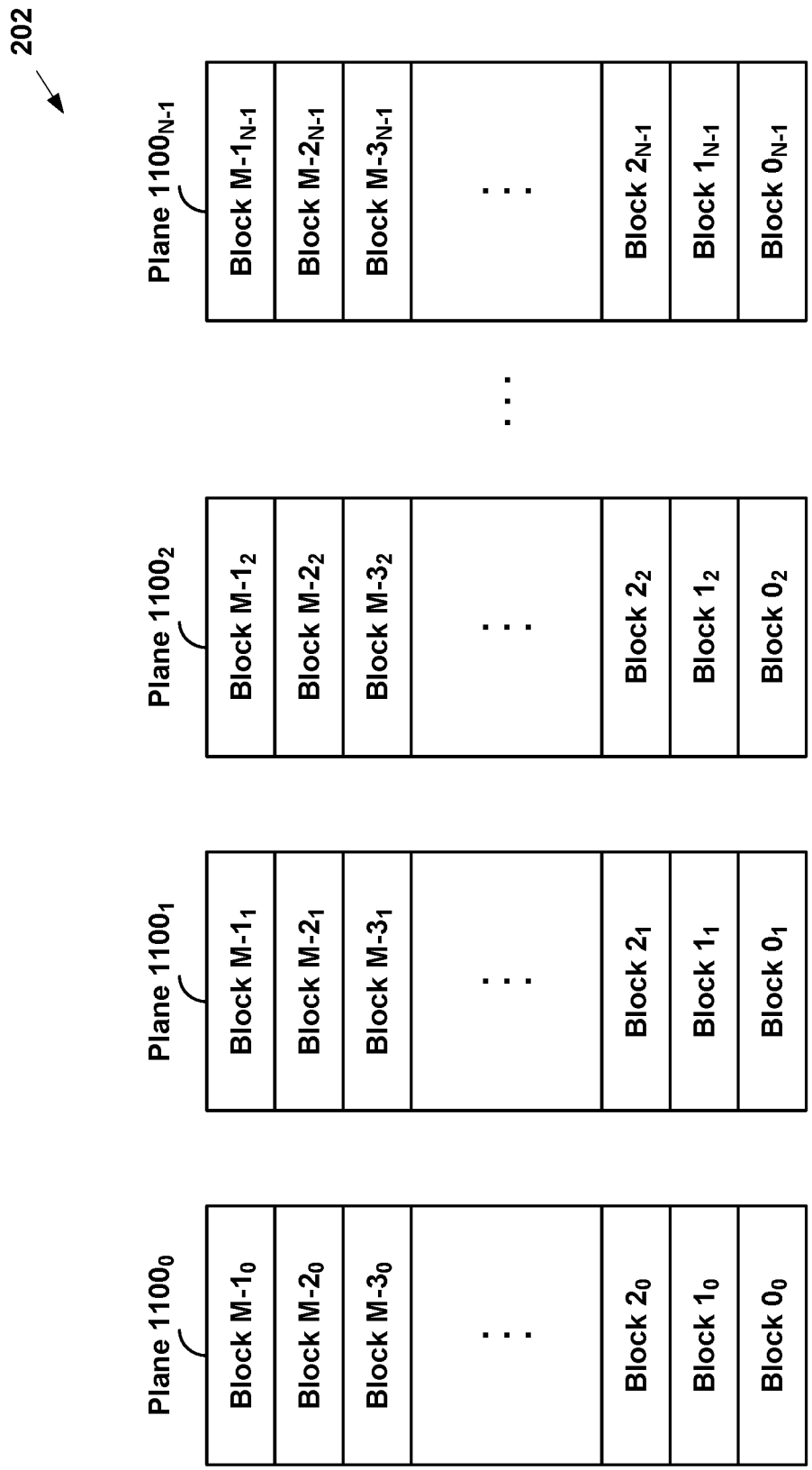
FIG. 11 is a block diagram of a memory structure having multiple planes.

As described above, in some embodiments a memory structure is divided into multiple planes. FIG. 11 is a block diagram depicting an embodiment of a simplified multi-plane organization of memory structure 202 (FIG. 2), which is divided into N planes: a first plane $1100_0$, a second plane $1100_1$, a third plane $1100_2$, . . ., and an N–$1^{st}$ plane $1100_{N-1}$, all located on the same memory die 200 (FIG. 2). In other embodiments, the N planes may be located on more than one memory die. In an embodiment, each plane is divided into M blocks. For example, first plane $1100_0$ is divided into blocks Block $0_0$, Block $1_0$, . . ., Block M–$1_0$, second plane $1100_1$ is divided into blocks Block $0_1$, Block $1_1$, . . ., Block M–$1_1$, and so on.

In an embodiment, each plane has about 2000 blocks (e.g., N≈2000), although more or fewer blocks may be used. In an embodiment, a block of memory cells is a unit of erase. That is, all memory cells of a block are erased together. In some embodiments, a block represents a group of connected memory cells as the memory cells of a block share a common set of word lines.

In an embodiment of a multi-plane erase operation, one or more erase pulses are applied to memory cells in one or more blocks in each of first plane $1100_0$, second plane $1100_1$, third plane $1100_2$, . . ., and N–$1^{st}$ plane $1100_{N-1}$. For example, one or more erase pulses may be applied to memory cells in blocks Block $0_0$, Block $0_1$, Block $0_2$, . . ., Block $0_{N-1}$ in first plane $1100_0$, second plane $1100_1$, third plane $1100_2$, . . ., and N–$1^{st}$ plane $1100_{N-1}$, respectively.

In an embodiment, one or more memory die memory die (e.g., memory die 106 of FIG. 1 or memory die 200 of FIG. 2) are packaged within a single integrated circuit (chip). In an embodiment, a chip is coupled to a power supply (e.g., Vcc), and the chip draws a power supply current (e.g., Icc) from the power supply. During various memory operations (e.g., programming, reading, erasing), the power supply current Icc varies with time and with the particular memory operations being performed.

Figure 12A:
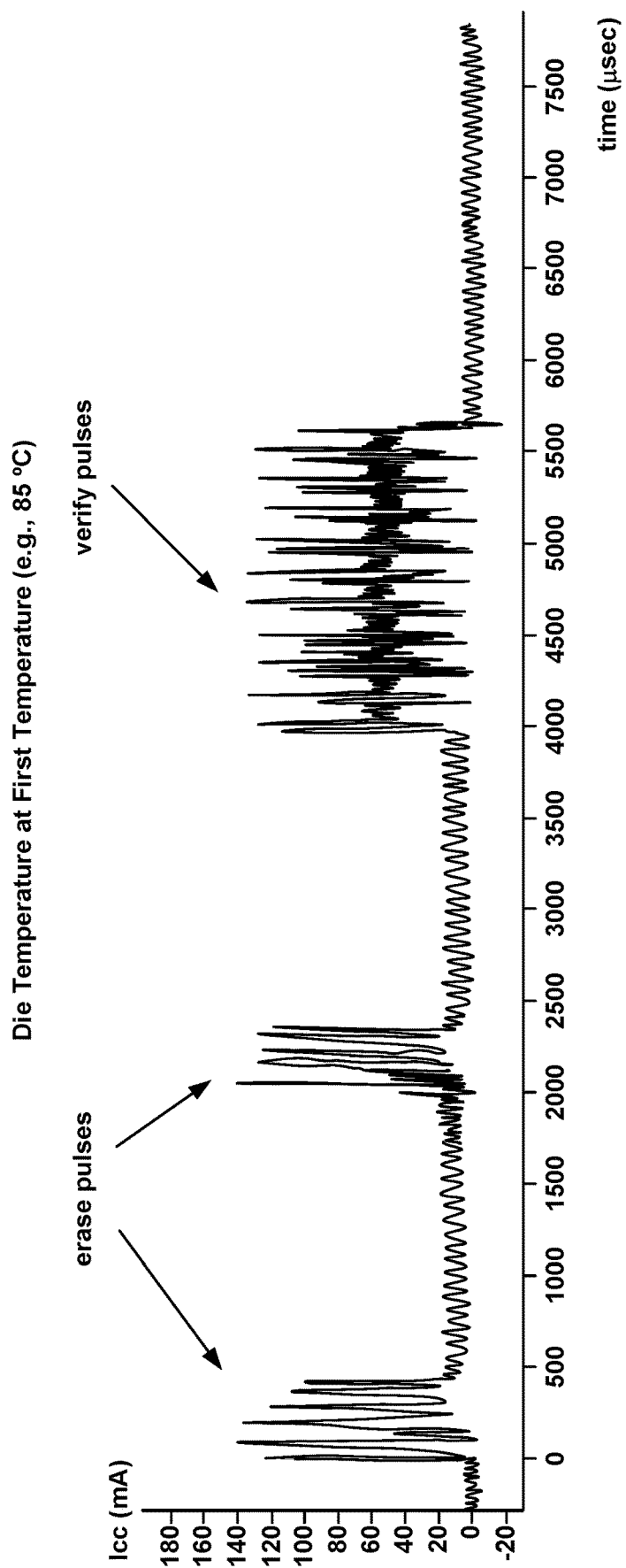
FIGS. 12A-12B are diagrams depicting example power supply current versus time during an erase operation.
Figure 12B:
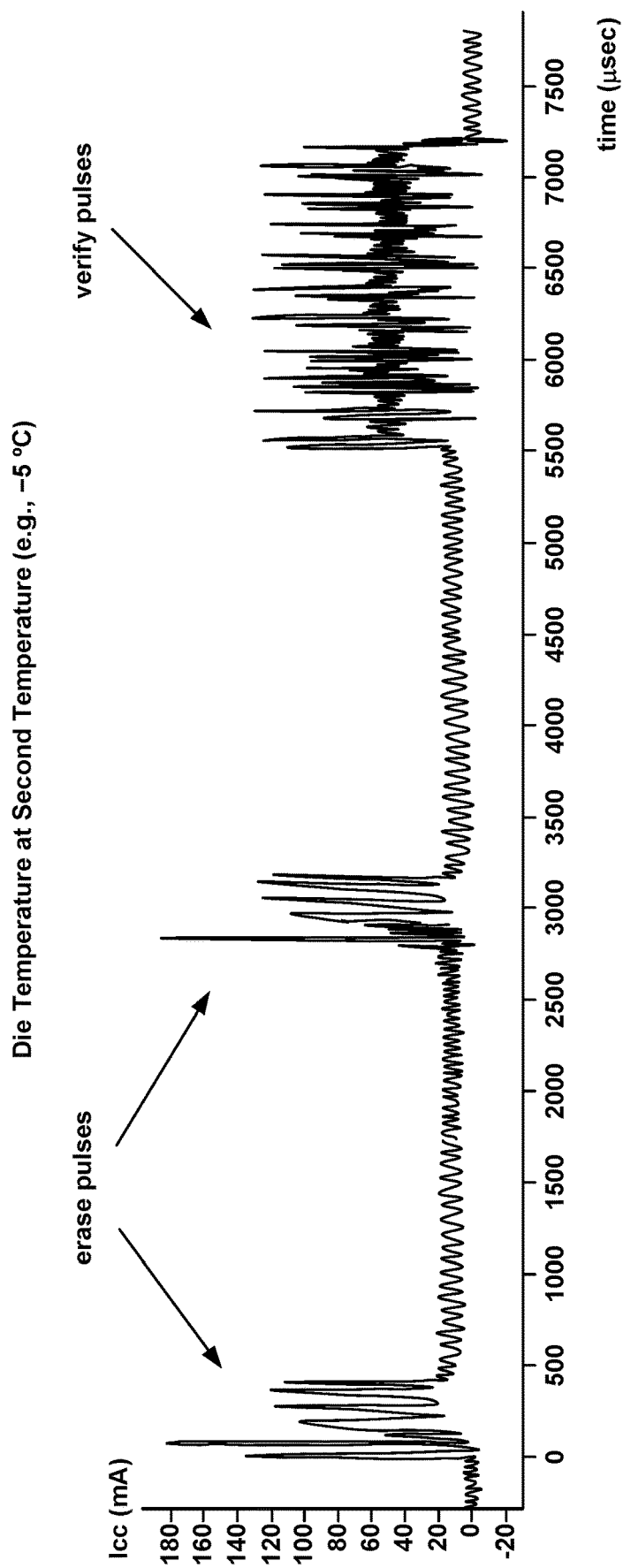

FIGS. 12A-12B are diagrams depicting example power supply current Icc versus time during an erase operation. In particular, FIG. 12A depicts example power supply current Icc versus time during an erase operation when the chip is at a first temperature (e.g., 85° C.), and FIG. 12B depicts example power supply current Icc versus time during an erase operation when the chip is at a second temperature (e.g., –5° C.) lower than the first temperature.

In the depicted embodiments, the erase operation includes two erase pulses followed by multiple verify pulses. In each example, power supply current Icc reaches a peak value during the erase pulses. In the example of FIG. 12A, power supply current Icc reaches a peak value of about 140 mA, whereas in the example of FIG. 12B power supply current Icc reaches a peak value of about 180 mA.

As described above, during an erase operation an erase pulse having a magnitude $V_E$ is applied to the memory cells of the erase block. As also described above, power control module 220 (FIG. 2) may include charge pump circuits for creating voltages such as program voltages, read voltages and erase voltages.

Figure 13:
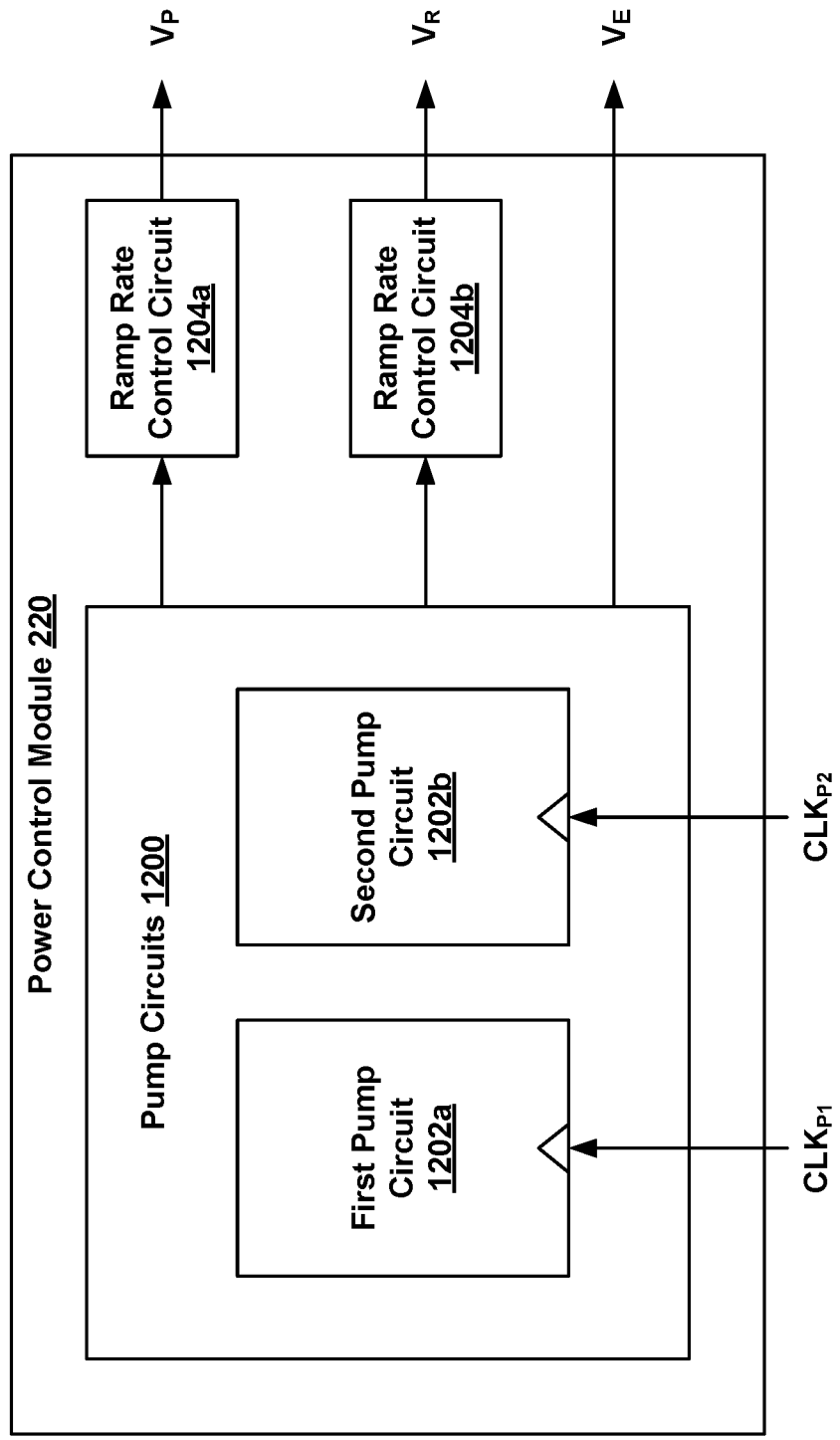
FIG. 13 is a simplified block diagram of an embodiment of power control module of FIG. 2.

FIG. 13 is a simplified block diagram of power control module 220. In particular, power control module 220 includes pump circuits 1200 (including a first pump circuit 1202a and a second pump circuit 1202b) coupled to a first ramp rate control circuit 1204a and a second ramp rate control circuit 1204b. In an embodiment, first pump circuit 1202a receives a first clock signal CLK and second pump circuit 1202b receives a second clock signal CLK. Persons of ordinary skill in the art will understand that power control module 220 may include additional circuits and provide additional voltages, and pump circuits 1200 may 1200 may include more or fewer than two pump circuits 1202a and 1202b.

In an embodiment, power control module 220 provides a programming voltage $V_P$, a read voltage $V_R$ and an erase voltage $V_E$. In an embodiment, first ramp rate control circuit 1204a is used to control a rise time of programming voltage $V_P$, and second ramp rate control circuit 1204b is used to control a rise time of read voltage $V_R$. In an embodiment, a ramp rate control circuit is not used in the output signal path used to provide erase voltage $V_E$.

Without wanting to be bound by any particular theory, it is believed that during an erase operation the peak values of power supply current Icc occur when charge pump circuits ramp erase voltage $V_E$ from a first value (e.g., 0V) to a second value (e.g., 12-16V). In addition, without wanting to be bound by any particular theory it is believed that the peak values of power supply current Icc are higher at lower temperatures as a result of lower resistance and capacitance values at lower temperatures.

In some implementations, during an erase operation the peak values of power supply current Icc may exceed maximum current specifications. For example, if power supply current Icc has a maximum current specification of 150 mA, the low temperature power supply current Icc depicted in FIG. 12B would exceed the specification and the device would be deemed a failure.

In embodiments, the absolute value of the peak values of power supply current Icc depends on a number of erase operations being concurrently performed. For example, power supply current Icc of FIG. 12B may have a peak value of 180 mA if erase operations are being concurrently performed on four die of a multi-die chip, but may have a lower peak value if operations are being concurrently performed on one die of a multi-die chip.

Without wanting to be bound by any particular theory it is believed that during an erase operation the peak values of power supply current Icc are high because power control circuit 220 does not limit a rise time of erase voltage $V_E$. In other words, because a rise time of erase voltage V is not limited, when pump circuits 1200 ramp erase voltage V from a first value (e.g., 0V) to a second value (e.g., 12-16V) peak values of power supply current Icc may exceed maximum current specifications.

One possible solution is to add a ramp rate control circuit to power control module 220 to control a rise time of erase voltage $V_E$. Although such a solution may result in lower peak values of power supply current Icc, the solution requires modifying the circuits of power control module 220, which requires time, expense and additional die real estate.

Another possible solution is to slow a cock rate of first clock signal $CLK_{P1}$ and second clock signal $CLK_{P2}$ to slow the rise time of erase voltage $V_E$. Although such a solution may result in lower peak values of power supply current Icc, the solution would also slow programming voltage $V_P$ and read voltage $V_R$ and would therefore undesirably increase program time and read time.

Technology is described to reduce power supply current Icc and peak values of power supply current Icc without requiring modifications to power control module 220 and without slowing programming voltage $V_P$ and read voltage $V_R$. In embodiments, during an erase operation a clock rate of first clock signal $CLK_{P1}$ and/or second clock signal $CLK_{P2}$ are selectively reduced. In embodiments, clock rate reduction only occurs during erase operations and does not occur during programming or reading operations.

Figure 14:
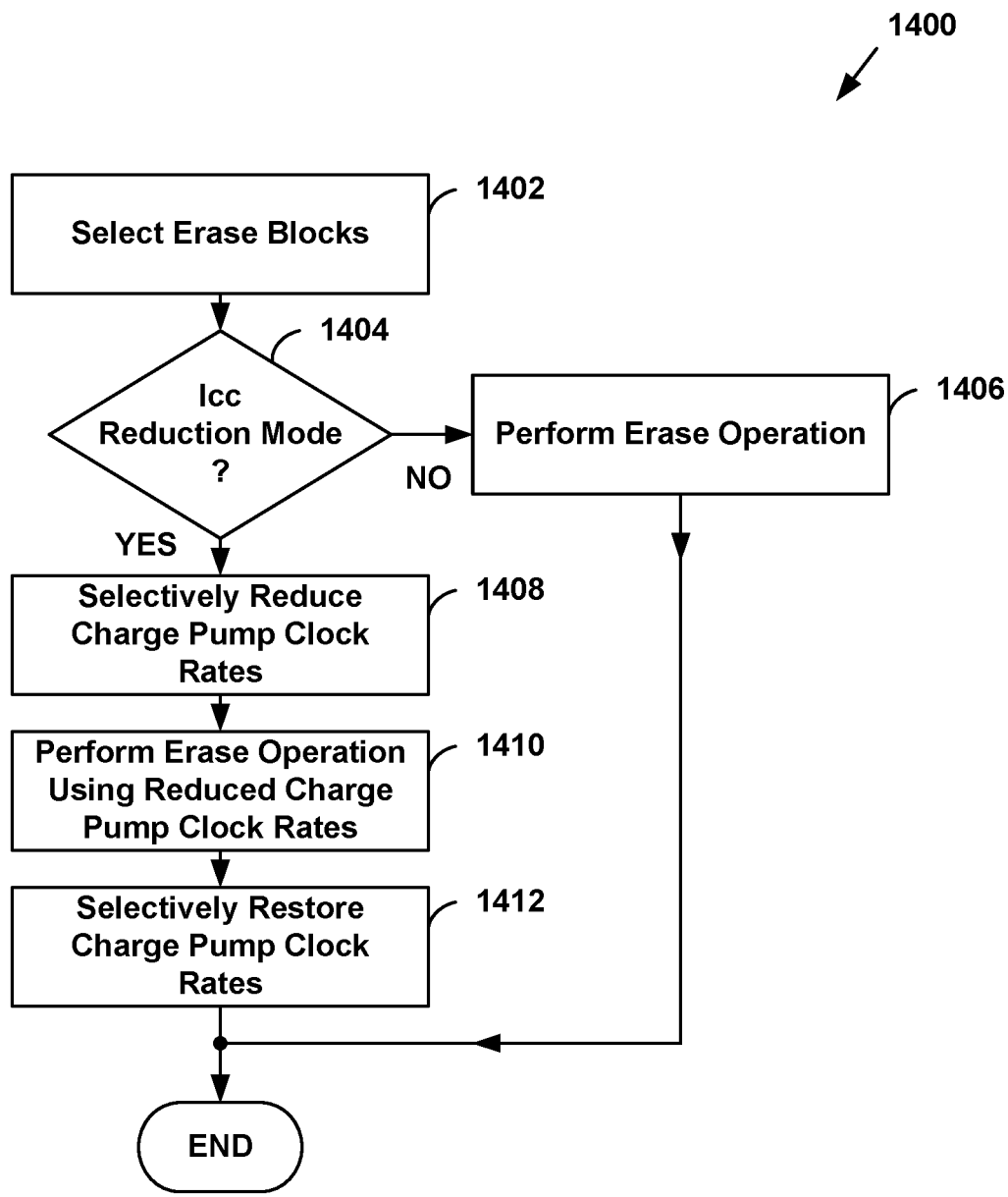
FIG. 14 is a flowchart describing an embodiment of a process for erasing a population of memory cells.

FIG. 14 is a flowchart describing an embodiment of a process 1400 for erasing a population of memory cells (e.g., one or more erase blocks of memory cells). In an example embodiment, process 1400 is performed on one or more memory die 106 (FIG. 1) using the control circuits discussed above. For example, process 1400 can be performed at the direction of state machine 216 (FIG. 2). In an embodiment, the one or more memory die 106 are disposed in an integrated circuit chip.

At step 1402, one or more erase blocks are selected to be erased. At step 1404, a determination is made whether power supply current Icc reduction mode should be performed. In embodiments, a variety of factors may be used to determine whether power supply current Icc reduction mode should be performed.

In an embodiment, a chip temperature $T_O$ is acquired. In an embodiment, chip temperature $T_O$ is a temperature at one or more locations on a memory die containing the memory cells being erased. In an embodiment, chip temperature $T_O$ is an average or median temperature at one or more locations on a memory die containing the memory cells being erased. In an embodiment, chip temperature $T_O$ may be determined from a temperature sensor circuit, such as temperature sensor circuit 222 of FIG. 2. Alternatively, other techniques may be used to determine chip temperature $T_O$.

In an embodiment, power supply current Icc reduction mode may be performed when chip temperature $T_O$ is below a threshold temperature $T_{save}$ (a first threshold value). In embodiments, $T_{save}$ may have a value determined by empirical measurements, by simulation, or a combination of the two. For example, $T_{save}$ may be set equal to room temperature or some other temperature.

In another embodiment, power supply current Icc reduction mode may be performed based on a number of memory die 106 in the integrated circuit chip that are operating in parallel. For example, an integrated circuit chip may include multiple memory die 106 (e.g., 4, 8, 16 or some other number of die). In some instances, one or more of the memory die 106 in the integrated circuit chip may be operating, while other die are in idle mode. Based on empirical measurements, simulation results, or a combination of the two, it may be determined that power supply current Icc reduction mode should be performed whenever more than N die (a second threshold value) are operating in parallel. For example, N may be 2, 3 or some other number.

In another embodiment, Icc reduction mode may be performed based on a peak values of power supply current Icc. For example, control circuits may monitor power supply current Icc. In an embodiment, power supply current Icc reduction mode may be performed when a peak value of power supply current Icc is above a threshold maximum power supply current $I_{smax}$ (a third threshold value).

In other embodiments, other factors may be used to determine whether power supply current Icc reduction mode should be performed. In addition, a determination whether power supply current Icc reduction mode should be performed may be based on more than one of the above example factors. For example, power supply current Icc reduction mode may be performed when a die temperature is below a threshold temperature $T_{save}$ and more than N die are operating in parallel. Other combinations of factors may be used to determine whether power supply current Icc reduction mode should be performed.

Referring again to FIG. 14, if at step 1404 a determination is made that power supply current Icc reduction mode should not be performed, at step 1406 an erase operation is performed. For example, the erase operation of process 1000 of FIG. 10 may be performed. After completing the erase operation of step 1406, process 1400 terminates.

If, however, at step 1404 a determination is made that power supply current Icc reduction mode should be performed, at step 1408 clock rates of one or more charge pump clocks are selectively reduced (that is, charge pump clock periods are selectively increased). For example, clock rates of one or both of first clock signal $CLK_{P1}$ and second clock signal $CLK_{P2}$ of FIG. 13 may be reduced. In embodiments, the amount of clock rate reduction may be based on empirical measurements, simulation results, or a combination of the two.

In an embodiment, the amount of clock rate reduction may be a function of temperature. For example, FIG. 15 is a diagram of example values of first clock signal $CLK_{P1}$ and second clock signal $CLK_{P2}$ as a function of die temperature $T_O$. In the illustrated example, first clock signal $CLK_{P1}$ and second clock signal $CLK_{P2}$ have values that are determined based on a nominal first clock signal $CLK_{P1n}$ and a nominal second clock signal $CLK_{P2n}$, respectively.

For example, for die temperature $T_O$ greater than 75° C. and less than or equal to 85° C., first clock signal $CLK_{P1}$ and second clock signal $CLK_{P2}$ have values equal to nominal first clock signal $CLK_{P1n}$ and nominal second clock signal $CLK_{P2n}$, respectively.

For die temperature $T_O$ greater than 65° C. and less than or equal to 75° C., first clock signal $CLK_{P1}$ and second clock signal $CLK_{P2}$ have values equal to $0.95 \times CLK_{P1n}$ and $0.97 \times CLK_{P2n}$, respectively. That is, the clock rate of first clock signal $CLK_{P1}$ is 95% of the clock rate of nominal first clock signal $CLK_{P1n}$, and the clock rate of second clock signal $CLK_{P2}$ is 97% of the clock rate of nominal second clock signal $CLK_{P2n}$.

For die temperature $T_O$ greater than 35° C. and less than or equal to 65° C., first clock signal $CLK_{P1}$ and second clock signal $CLK_{P2}$ have values equal to $0.94 \times CLK_{P1n}$ and $0.96 \times CLK_{P2n}$, respectively. That is, the clock rate of first clock signal $CLK_{P1}$ is 94% of the clock rate of nominal first clock signal $CLK_{P1n}$, and the clock rate of second clock signal $CLK_{P2}$ is 96% of the clock rate of nominal second clock signal $CLK_{P2n}$.

For die temperature $T_O$ greater than 15° C. and less than or equal to 35° C., first clock signal CLK and second clock signal CLK have values equal to $0.92 \times CLK_{P1n}$ and $0.90 \times CLK_{P2n}$, respectively. That is, the clock rate of first clock signal $CLK_{P1}$ is 92% of the clock rate of nominal first clock signal $CLK_{P1n}$, and the clock rate of second clock signal $CLK_{P2}$ is 90% of the clock rate of nominal second clock signal $CLK_{P2n}$.

For die temperature $T_O$ greater than 5° C. and less than or equal to 15° C., first clock signal $CLK_{P1}$ and second clock signal $CLK_{P2}$ have values equal to $0.89 \times CLK_{P1n}$ and $0.87 \times CLK_{P2n}$, respectively. That is, the clock rate of first clock signal $CLK_{P1}$ is 89% of the clock rate of nominal first clock signal $CLK_{P1n}$, and the clock rate of second clock signal $CLK_{P2}$ is 87% of the clock rate of nominal second clock signal $CLK_{P2n}$.

For die temperature $T_O$ greater than −2° C. and less than or equal to 5° C., first clock signal $CLK_{P1}$ and second clock signal $CLK_{P2}$ have values equal to $0.80 \times CLK_{P1n}$ and $0.83 \times CLK_{P2n}$, respectively. That is, the clock rate of first clock signal $CLK_{P1}$ is 80% of the clock rate of nominal first clock signal $CLK_{P1n}$, and the clock rate of second clock signal $CLK_{P2}$ is 83% of the clock rate of nominal second clock signal $CLK_{P2n}$.

In this example, as die temperature $T_O$ decreases, clock rates of first clock signal $CLK_{P1}$ and second clock signal $CLK_{P2}$ decrease. Persons of ordinary skill in the art will understand that the die temperature $T_O$ stepwise breakpoint values may be other than those depicted in FIG. 15, and that more or fewer stepwise breakpoint values may be used.

In addition, persons of ordinary skill in the art will understand that fractional values of the clock rates of nominal first clock signal $CLK_{P1n}$ and nominal second clock signal $CLK_{P2n}$ other than the example values depicted in FIG. 15 may be used.

In an alternative embodiment, a linear or non-linear equation may be used to determine the clock rate of first clock signal $CLK_{P1}$ and the clock rate of second clock signal $CLK_{P2}$ as a function of temperature.

In the example of FIG. 15, clock rate reduction of first clock signal $CLK_{P1}$ and second clock signal $CLK_{P2}$ is determined based on die temperature $T_O$. In other embodiments, clock rate reduction of first clock signal $CLK_{P1}$ and second clock signal $CLK_{P2}$ may be determined based on a number of a number of die operating in parallel. For example, as the number of die operating in parallel increases, the clock rates of first clock signal $CLK_{P1}$ and second clock signal $CLK_{P2}$ may be decreased.

In another embodiment, clock rate reduction of first clock signal $CLK_{P1}$ and second clock signal $CLK_{P2}$ may be determined based on a peak value of power supply current Icc. For example, as the peak value of power supply current Icc increases, the clock rates of first clock signal $CLK_{P1}$ and second clock signal $CLK_{P2}$ may be decreased. Persons of ordinary skill in the art will understand that other factors or combinations of factors may be used to determine clock rate reduction of first clock signal $CLK_{P1}$ and second clock signal $CLK_{P2}$.

Referring again to FIG. 14, at step 1410 an erase operation is performed using the selectively reduced charge pump clock rates determined at step 1408. For example, the erase operation of process 1000 of FIG. 10 may be performed using erase voltage $V_E$ generated by power control module 220 of FIG. 13 with the selectively reduced charge pump clock rates of first clock signal $CLK_{P1}$ and second clock signal $CLK_{P2}$ determined at step 1408.

Referring again to FIG. 14, after completing the erase operation of step 1410 at step 1412 the clock rates of first clock signal $CLK_{P1}$ and second clock signal $CLK_{P2}$ are restored to their nominal values. In an embodiment, restoring the clock rates of first clock signal $CLK_{P1}$ and second clock signal $CLK_{P2}$ constitutes increasing the clock rates of first clock signal $CLK_{P1}$ and second clock signal $CLK_{P2}$. For example, first clock signal $CLK_{P1}$ and second clock signal $CLK_{P2}$ are restored to nominal first clock signal $CLK_{P1n}$ and nominal second clock signal $CLK_{P2n}$, respectively. Process 1400 then terminates.

Figure 16:
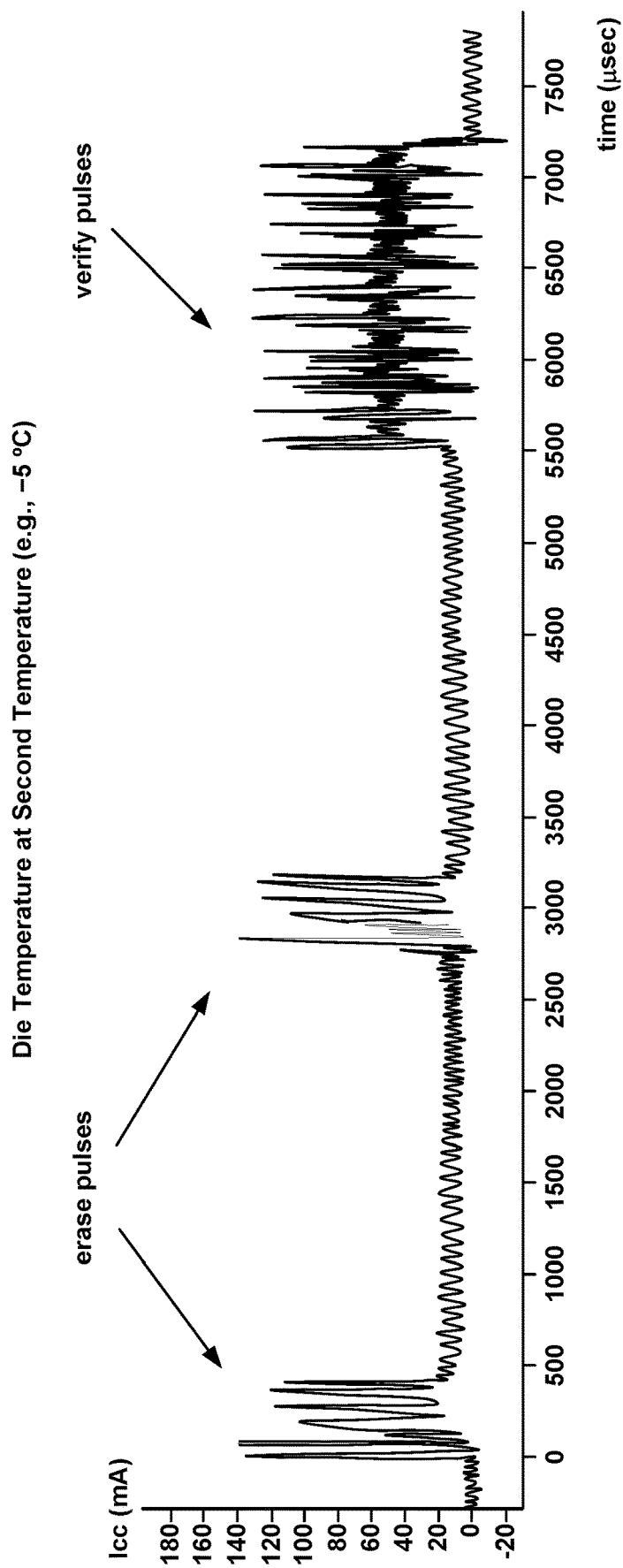
FIG. 16 is a diagram depicting example power supply current versus time during an erase operation performed in power supply current reduction mode.

FIG. 16 depicts example power supply current Icc versus time during an erase operation performed in power supply current Icc reduction mode (e.g., using example process 1400 of FIG. 14) when the chip is at second temperature (e.g., −5° C.) lower than the first temperature. In the depicted embodiment, the erase operation includes two erase pulses followed by multiple verify pulses. As in the example of FIG. 12B, power supply current Icc reaches a peak value during the erase pulses. In contrast to the example of FIG. 12B, in the example of FIG. 16 power supply current Icc reaches a peak value of about 140 mA.

Without wanting to be bound by any particular theory, it is believed that example process 1400 may be used to reduce power supply current Icc and peak values of power supply current Icc without requiring modifications to power control module 220 and without slowing programming voltage $V_P$ and read voltage $V_R$.

One embodiment includes an apparatus that includes a plurality of non-volatile memory cells, a charge pump circuit configured to receive a clock signal and provide a plurality of voltages to the non-volatile memory cells, and a control circuit coupled to the non-volatile memory cells and the charge pump circuit. The control circuit is configured to reduce a current consumed by the apparatus by selectively reducing a clock rate of the clock signal depending on a memory operation being performed on the non-volatile memory cells.

One embodiment includes a method including erasing a plurality of non-volatile memory cells disposed in an integrated circuit chip by determining that a power supply current consumed by the integrated circuit chip should be reduced, and selectively reducing a clock rate of a charge pump circuit that is configured to provide an erase voltage to the non-volatile memory cells.

One embodiment includes an apparatus that includes an integrated circuit chip comprising a memory die that includes a plurality of non-volatile memory cells, a charge pump circuit configured to operate at a first clock rate to provide a program voltage, and a control circuit coupled to the non-volatile memory cells. The control circuit is configured to erase a block of the non-volatile memory cells by configuring the charge pump circuit to operate at a second clock rate to provide an erase voltage to the block of the non-volatile memory cells, wherein the second clock rate is less than the first clock rate.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a plurality of non-volatile memory cells;
   a charge pump circuit configured to receive a clock signal and provide a plurality of voltages to the non-volatile memory cells; and
   a control circuit coupled to the non-volatile memory cells and the charge pump circuit, the control circuit configured to reduce a current consumed by the apparatus by selectively reducing a clock rate of the clock signal based on a memory operation being performed on the non-volatile memory cells
   wherein the non-volatile memory cells are disposed in a plurality of integrated circuit die; and
   wherein the control circuit is further configured to selectively reduce the clock rate based on a number of the integrated circuit die that are operating in parallel.

2. The apparatus of claim 1, wherein the control circuit is further configured to selectively reduce the clock rate during an erase operation.

3. The apparatus of claim 1, wherein the control circuit is further configured to only selectively reduce the clock rate during an erase operation.

4. The apparatus of claim 1, wherein:
   the non-volatile memory cells are disposed in an integrated circuit chip; and
   the control circuit is further configured to selectively reduce the clock rate based on a temperature of the integrated circuit chip.

5. The apparatus of claim 1, wherein:
   the non-volatile memory cells are disposed in an integrated circuit chip; and
   the control circuit is further configured to selectively reduce the clock rate based on a power supply current consumed by the integrated circuit chip.

6. The apparatus of claim 1, wherein:
   the non-volatile memory cells are disposed in a plurality of integrated circuit die that are disposed in an integrated circuit chip; and
   the control circuit is further configured to selectively reduce the clock rate based on more than one of a temperature of the integrated circuit chip, a number of the integrated circuit die that are operating in parallel, and a power supply current consumed by the integrated circuit chip.

7. The apparatus of claim 1, wherein the control circuit is further configured to selectively restore the clock rate after completing the memory operation.

8. The apparatus of claim 7, wherein selectively restoring comprises increasing the clock rate.

9. The apparatus of claim 1, wherein the control circuit is further configured to reduce a current consumed by the apparatus without increasing a program time of the non-volatile memory cells.

10. The apparatus of claim 1, wherein the control circuit is further configured to reduce a current consumed by the apparatus without increasing a read time of the non- volatile memory cells.

11. The apparatus of claim 1, wherein the plurality of voltages comprise a program voltage, a read voltage and an erase voltage.

12. A method comprising:
erasing a plurality of non-volatile memory cells disposed in an integrated circuit chip by:
determining that a power supply current consumed by the integrated circuit chip should be reduced; and
selectively reducing a clock rate of a charge pump circuit that is configured to provide an erase voltage to the non-volatile memory cells
wherein the non-volatile memory cells are disposed in a plurality of integrated circuit die; and
wherien determining comprises determining that a number of the integrated circuit die that are operating in parallel exceeds a second threshold value.

13. The method of claim 12, wherein:
the non-volatile memory cells are disposed in an integrated circuit chip; and
determining comprises determining that a temperature of the integrated circuit chip is less than a first threshold value.

14. The method of claim 12, wherein determining comprises determining that the power supply current exceeds a third threshold value.

15. The method of claim 12, wherein:
the non-volatile memory cells are disposed in a plurality of integrated circuit chip; and
determining comprises determining that more than one of a temperature of the integrated circuit chip is less than a first threshold value, a number of the integrated circuit die that are operating in parallel exceeds a second threshold value, and the power supply current consumed by the integrated circuit chip exceeds a third threshold value.

16. The method of claim 12, further comprising selectively restoring the clock rate after completing the erase operation.

17. The method of claim 12, wherein selectively reducing the clock rate does not increase a program time of the non-volatile memory cells.

18. An apparatus comprising:
an integrated circuit chip comprising a memory die that includes a plurality of non-volatile memory cells;
a charge pump circuit configured to operate at a first clock rate to provide a program voltage; and
a control circuit coupled to the non-volatile memory cells, the control circuit configured to erase a block of the non-volatile memory cells by configuring the charge pump circuit to operate at a second clock rate to provide an erase voltage to the block of the non-volatile memory cells, wherein the second clock rate is less than the first clock rate
wherein the control circuit is further configured to selectively reduce the clock rate based on a number of the integrated circuit chips that are operating in parallel.

* * * * *